United States Patent
Dittus et al.

(10) Patent No.: US 7,975,860 B2
(45) Date of Patent: Jul. 12, 2011

(54) TOOLLESS RAIL MOUNTING FOR A COMPUTER SYSTEM RACK

(75) Inventors: Karl Klaus Dittus, Durham, NC (US); Eric Alan Eckberg, Rochester, MN (US); Michael Sven Miller, Raleigh, NC (US); Stephen Peter Mroz, Rochester, MN (US); Scott Alan Shurson, Mantorville, NC (US); John Joseph Struble, Jr., Mebane, NC (US)

(73) Assignee: International Business Machines Corporation, Armonk, NY (US)

( * ) Notice: Subject to any disclaimer, the term of this patent is extended or adjusted under 35 U.S.C. 154(b) by 577 days.

(21) Appl. No.: 12/106,451

(22) Filed: Apr. 21, 2008

(65) Prior Publication Data
US 2009/0261051 A1    Oct. 22, 2009

(51) Int. Cl.
 *A47B 43/00* (2006.01)
(52) U.S. Cl. ................................ 211/207; 211/192
(58) Field of Classification Search ............... 211/207, 211/187, 103, 190, 191, 192; 108/193, 147.17, 108/146.16; 312/334.4, 334.5, 334.7
See application file for complete search history.

(56) References Cited

U.S. PATENT DOCUMENTS

| | | | | |
|---|---|---|---|---|
| 3,900,111 A * | 8/1975 | Hiler et al. | ...................... | 211/192 |
| 4,285,436 A * | 8/1981 | Konstant et al. | ............... | 211/192 |
| 4,382,518 A * | 5/1983 | Bondoux | ...................... | 211/192 |
| 4,618,064 A * | 10/1986 | Viklund | ......................... | 211/192 |
| 4,778,067 A * | 10/1988 | Bellerose | ..................... | 211/187 |
| 4,955,743 A * | 9/1990 | King | .............................. | 403/254 |
| 5,265,740 A * | 11/1993 | Hodsden et al. | ............... | 211/187 |
| 5,735,411 A * | 4/1998 | Flamme et al. | .................. | 211/26 |
| 6,158,599 A * | 12/2000 | Lazarus | ..................... | 211/90.01 |
| 6,318,823 B1 | 11/2001 | Liao | | |
| 6,422,399 B1 * | 7/2002 | Castillo et al. | ................... | 211/26 |
| 6,469,899 B2 | 10/2002 | Hastings et al. | | |
| 6,473,307 B2 | 10/2002 | Mallette | | |
| 6,739,682 B2 | 5/2004 | Shih | | |
| 6,754,066 B2 | 6/2004 | Doan et al. | | |
| 6,769,551 B2 * | 8/2004 | Rafferty et al. | .................. | 211/26 |
| 6,856,505 B1 | 2/2005 | Venegas et al. | | |
| 6,962,397 B2 | 11/2005 | Dobler et al. | | |
| 7,513,374 B2 * | 4/2009 | Smith et al. | .................. | 211/26.2 |
| 2001/0035704 A1 * | 11/2001 | Dierbeck | ...................... | 312/902 |
| 2002/0195410 A1 * | 12/2002 | Lin | ................ | 211/190 |
| 2004/0057216 A1 | 3/2004 | Smith et al. | | |
| 2004/0104184 A1 * | 6/2004 | Hartman et al. | ................. | 211/26 |
| 2005/0068745 A1 | 3/2005 | Hartman | | |
| 2005/0117309 A1 | 6/2005 | Rieken et al. | | |
| 2006/0169659 A1 * | 8/2006 | Robinson et al. | ............. | 211/187 |

(Continued)

*Primary Examiner* — Jennifer E. Novosad
(74) *Attorney, Agent, or Firm* — Cynthia G. Seal; Jeffrey L. Streets

(57) ABSTRACT

A rack for supporting electronic devices and modules with adjustable rails. The rack has a vertical wall with a set of holes at various elevations, each set of holes including at least a proximal hole evenly spaced apart from a distal hole. A longitudinally-extending rail has a set of clips for selectively securing the rail to the vertical wall, wherein the set of clips includes at least a proximal clip selectively receivable in the proximal hole at a selected elevation for supporting a proximal end of the rail and a distal clip selectively receivable in the distal hole at the selected elevation for supporting a distal end of the rail. The system may include a second rail for securing to an opposing vertical wall of the rack to form a shelf or bay for an electronic device. Each rail may be latched in place and can be selectively installed and removed without use of tools.

16 Claims, 5 Drawing Sheets

U.S. PATENT DOCUMENTS

2006/0261025 A1* 11/2006 Heyderman et al. .......... 211/187
2007/0221597 A1* 9/2007 Chen ............................. 211/192
2007/0242420 A1 10/2007 Hoshino et al.

* cited by examiner

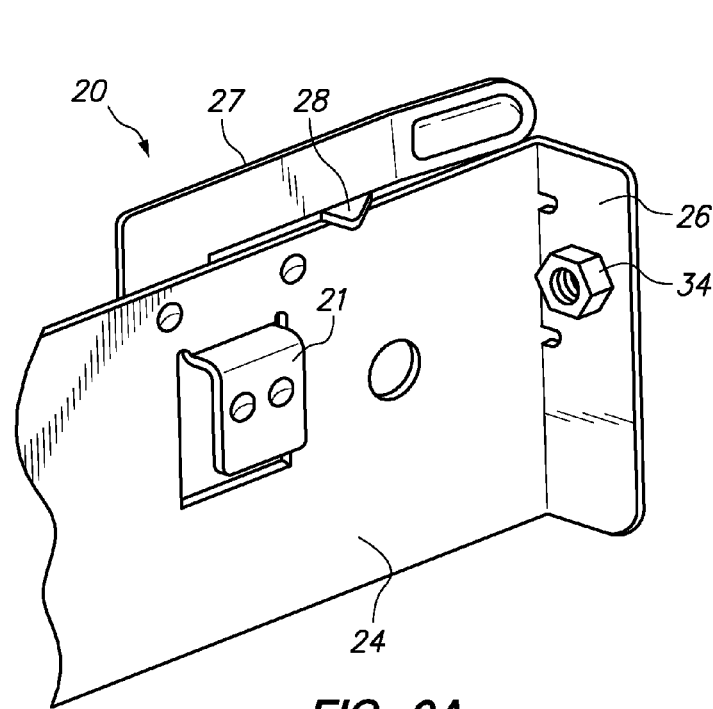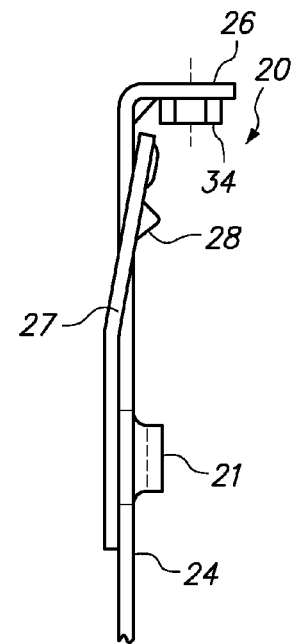
FIG. 2A  FIG. 2B
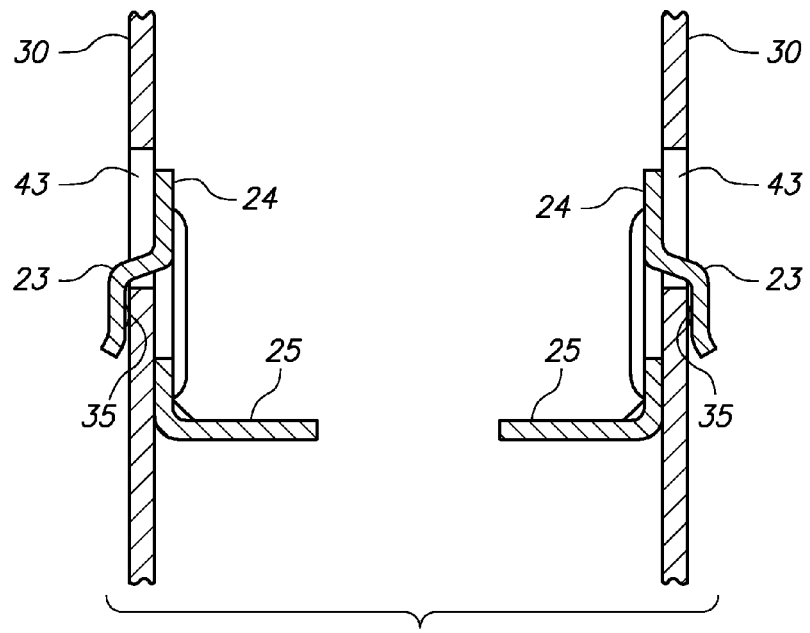
FIG. 3

TOOLLESS RAIL MOUNTING FOR A COMPUTER SYSTEM RACK

BACKGROUND OF THE INVENTION

1. Field of the Invention

The present invention relates to adjustable rails for supporting equipment in a rack, and more specifically to rails that can be secured without the use of tools.

2. Background of the Related Art

Electronic devices, including data processing devices such as servers, are typically housed in standardized equipment enclosures. These enclosures have side walls that establish or include a rack. The rack is a substantially rectilinear metal frame having a plurality of mounting and alignment openings or holes that permit mounting various devices in the rack.

Rails are mounted to the walls or other support structure in the rack and form support for the electronic devices or components. The rails are screwed, bolted, or otherwise attached to the rack and the devices are placed on a pair or set of rails secured to opposing walls of the rack. In order to be attached to the rack the length of the rails must be appropriately configured to cooperate with the rack.

Because a computer system may not completely fill a rack and because individual devices or chassis may have various heights, it is desirable to have rails that can be selectively mounted at desired heights within the rack. In this manner, the vertical spacing between rails can be incrementally adjusted to accommodate specific devices as the computer system is being installed or reconfigured. Typically, the height of a device is an integer multiple of a "unit" height (otherwise known as a "U"), wherein each unit of height measures 1.75 inches. Standardized rack specifications are provided by the Electronic Industries Alliance (EIA).

BRIEF SUMMARY OF THE INVENTION

One embodiment of the present invention provides a system comprising a rack having a vertical wall with a set of holes at each of a plurality of elevations, each set of holes including at least a proximal hole evenly spaced apart from a distal hole. The system further comprises a longitudinally-extending rail having a set of clips for selectively securing the rail to the vertical wall, wherein the set of clips includes at least a proximal clip selectively receivable in the proximal hole at a selected elevation for supporting a proximal end of the rail and a distal clip selectively receivable in the distal hole at the selected elevation for supporting a distal end of the rail. In most installations, the system will also include a second longitudinally-extending rail for securing to an opposing vertical wall of the rack in a similar manner. Accordingly, first and second opposing rails may form a shelf or other support for an electronic device.

Another embodiment of the present invention provides a method of installing a rail in a computer system rack. The method comprises longitudinally positioning the rail along a vertical wall of the rack, wherein the rail is positioned to extend between a proximal hole in the vertical wall at a selected elevation and a distal hole in the vertical wall at the selected elevation. A proximal clip of the rail is inserted through the proximal hole and a distal clip of the rail is inserted through the distal hole, wherein the clip limits downward and lateral movement of the rail. The rail is moved longitudinally so that each of the inserted proximal and distal clips slide into a slot extending from each of the proximal and distal holes to limit upward movement of the rail. The rail is automatically latched against longitudinal movement in response to the proximal and distal clips being received in the slots. Alternatively, the rail could be manually secured against longitudinal movement with a screw extending through the rail and into the rack side wall.

BRIEF DESCRIPTION OF THE SEVERAL VIEWS OF THE DRAWINGS

FIGS. 2A-B are perspective and top views of a proximal end of a rail.

FIG. 3 is a cross-sectional view of opposing rails secured to opposing side walls of a rack.

DETAILED DESCRIPTION OF THE INVENTION

Figure 1A:
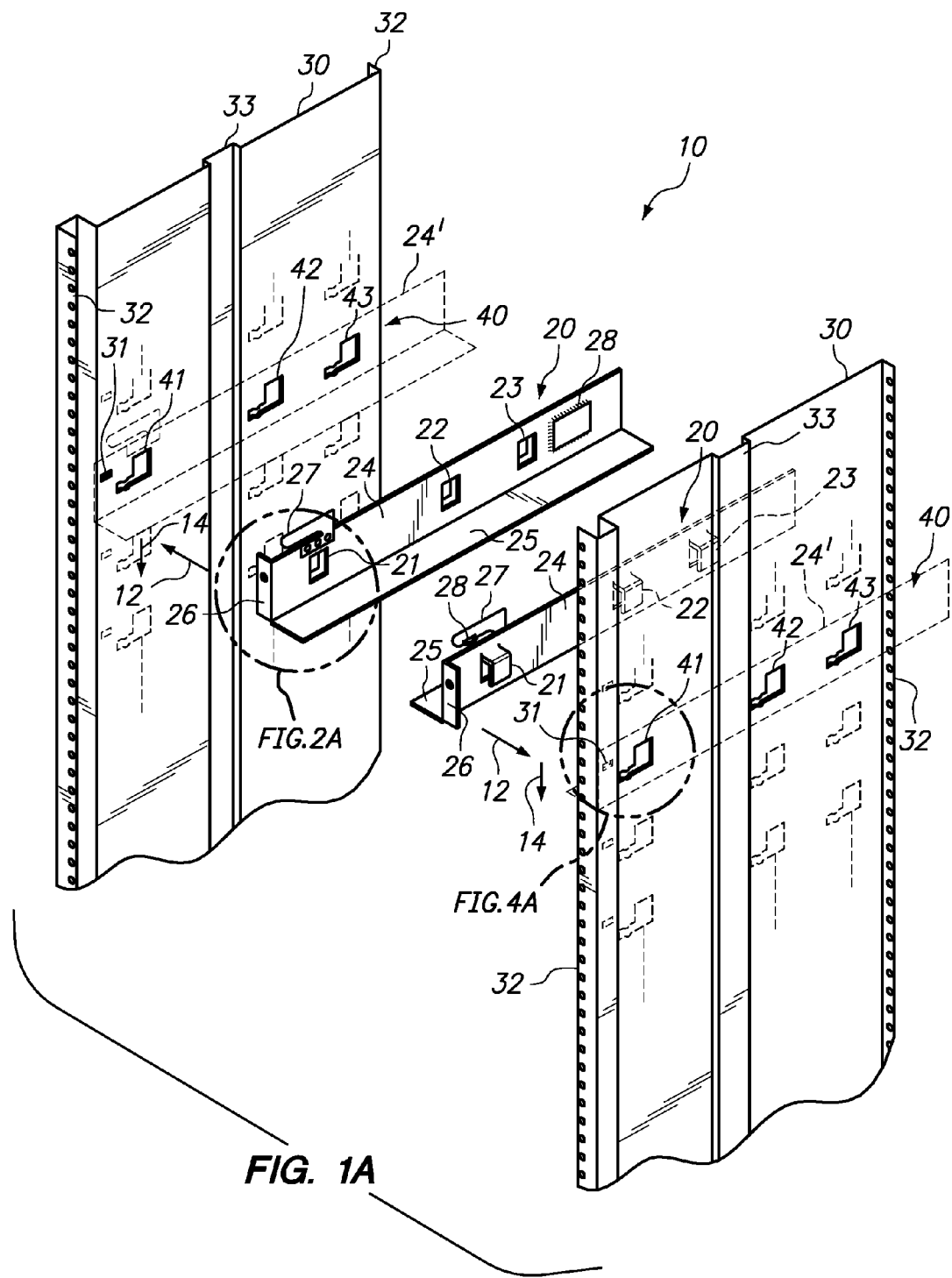
FIGS. 1A-C are perspective views of two rails being stepwise aligned, secured and latched to opposing side walls of a rack.

One embodiment of the present invention provides a system comprising a rack having a vertical wall with a set of holes at each of a plurality of elevations, each set of holes including at least a proximal hole spaced apart from a distal hole. The system further comprises a longitudinally-extending rail having a set of clips for selectively securing the rail to the vertical wall, wherein the set of clips includes at least a proximal clip selectively receivable in the proximal hole at a selected elevation for supporting a proximal end of the rail and a distal clip selectively receivable in the distal hole at the selected elevation for supporting a distal end of the rail. In most installations, the system will also include a second longitudinally-extending rail for securing to an opposing vertical wall of the rack in a similar manner. Accordingly, first and second opposing rails may form a shelf or other support for an electronic device. For example, a rail may include a shelf laterally-extending away from the vertical wall.

Optionally, each clip may form an inverted hook that hangs in one of the holes to limit downward travel of the rail and establish the vertical elevation of the rail. Furthermore, each clip preferably includes a boss or angled profile to draw the rail firmly against the rack wall. Still further, each hole in the rack wall preferably includes a lateral slot at the base of the hole, wherein one of the clips may slide into the slot to limit upward movement of the rail. This not only prevents accidental detachment of the rail from the rack, but also makes the attachment more secure against vibration and rattling. In a further option, the rail may include a selectively releasable latch for engaging a latch hole in the wall to limit longitudinal movement of the rail. The combination of the hole, slot and latch secure the rail against movement in any direction. Advantageously, this system is preferably implemented without requiring the use of tools to install or remove a rail.

Most preferably, the rail can be installed without access to the back of the rack. Furthermore, the latch is preferably disposed at the proximal end of the rail to facilitate manual release of the rail from the front of the rack. Still further, a highly preferred rail can be installed in a 2U space of the rack without removing modules or rails immediately above or below the 2U space.

Another embodiment of the present invention provides a method of installing a rail in a computer system rack. The method comprises longitudinally positioning the rail along a vertical wall of the rack, wherein the rail is positioned to extend between a proximal hole in the vertical wall at a selected elevation and a distal hole in the vertical wall at the selected elevation. A proximal clip of the rail is inserted through the proximal hole and a distal clip of the rail is inserted through the distal hole, wherein the clip limits downward and lateral movement of the rail. The rail is moved longitudinally so that each of the inserted proximal and distal clips slide into a slot extending from each of the proximal and distal holes to limit upward movement of the rail. The rail is automatically latched against longitudinal movement in response to the proximal and distal clips being received in the slots. The method is preferably repeated to secure a second rail to an opposing side wall of the rack at the same elevation. It should be recognized that each rail may be detached from the rack wall by manually releasing the latch, sliding the clips out of the slots, and withdrawing the clips from the holes. Optionally, the method may further include engaging the distally sliding electronic module along the shelf bracket and against a boss formed on the shelf bracket to improve lateral alignment of the electronic module between the opposing rails.

The various embodiments of the invention may be understood in greater detail by reference to a specific embodiment set out in the following drawings. It should be understood that the embodiment shown in the following Figures is described as an example of the invention and that the invention is not limited to this embodiment.

Figure 1B:
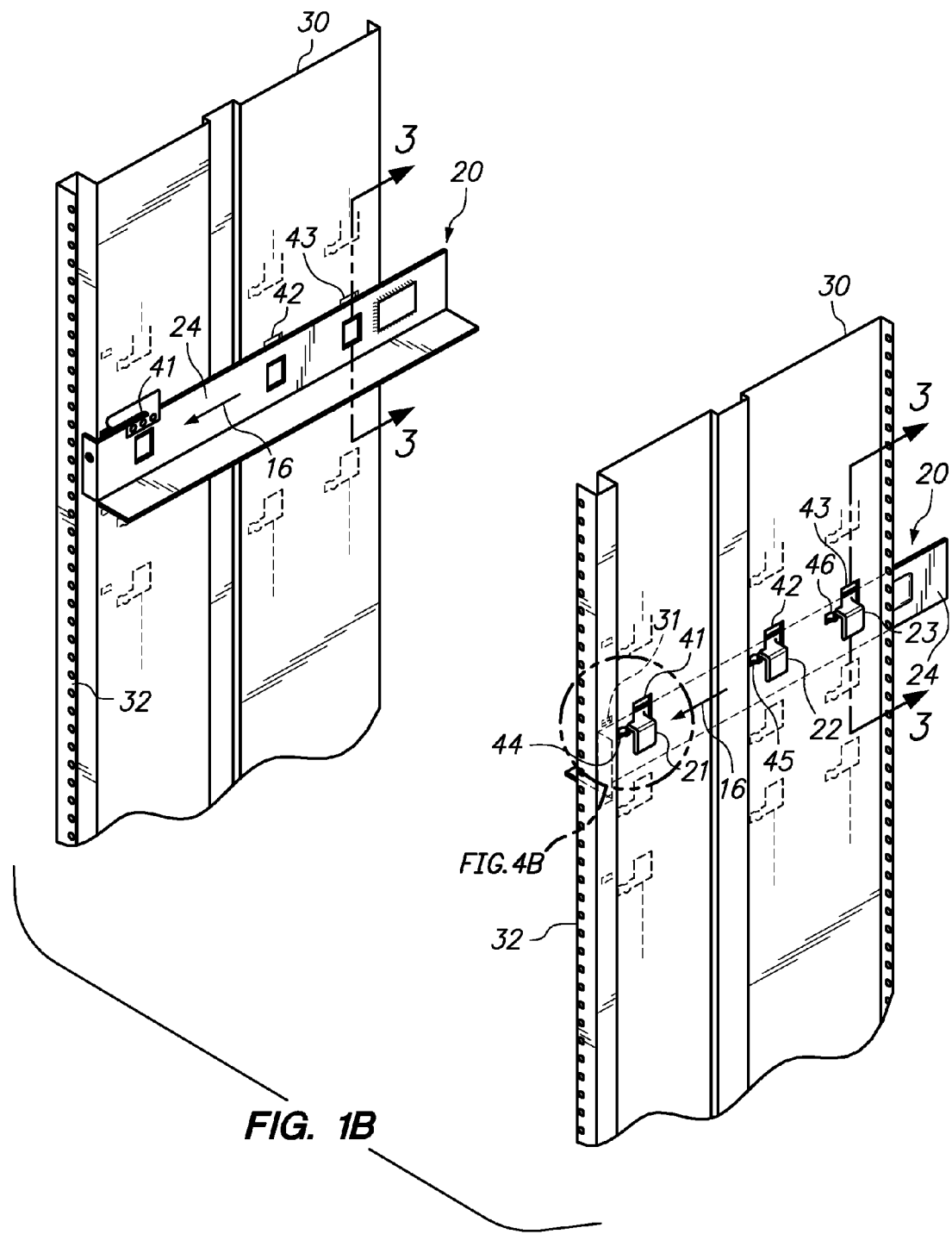
Figure 1C:
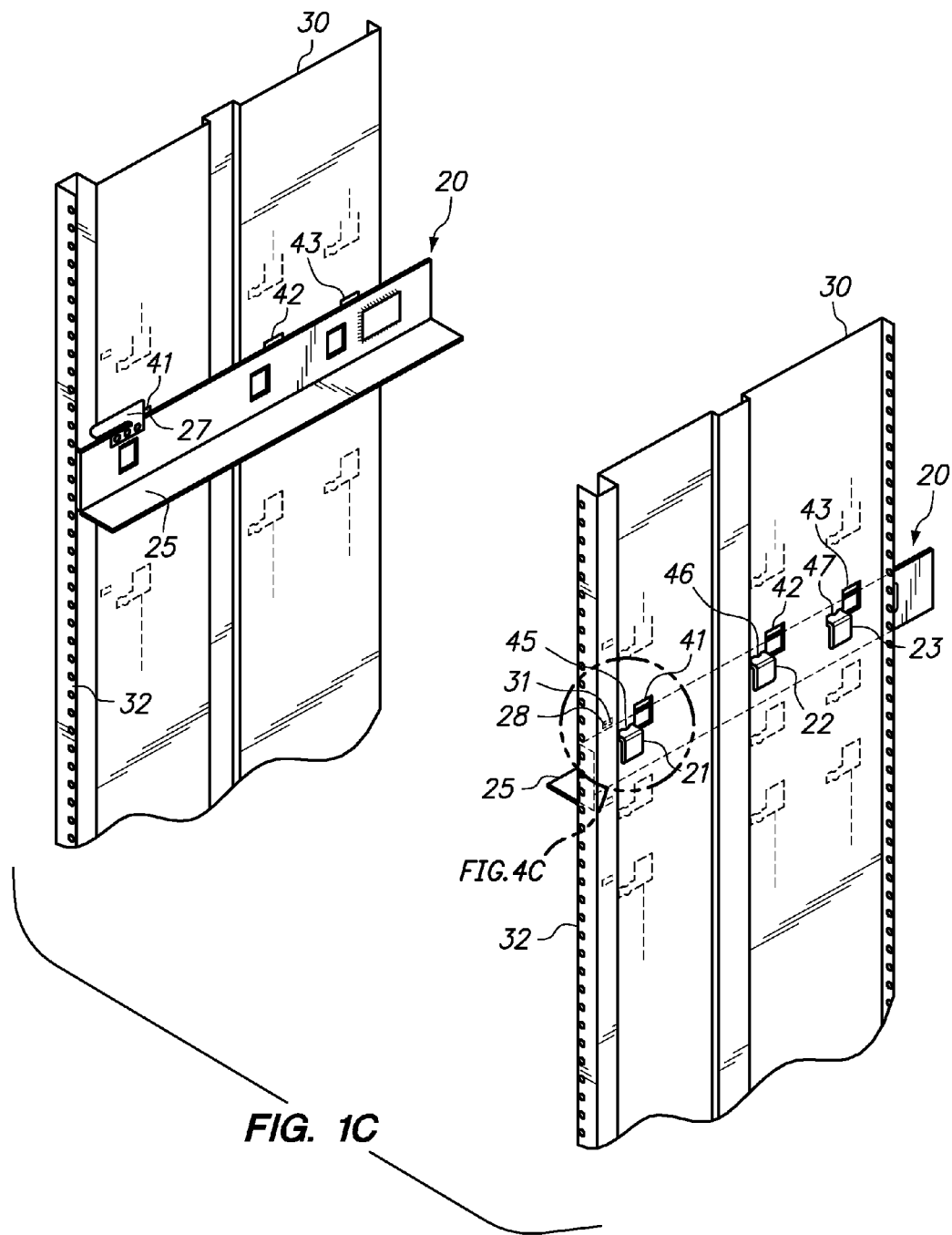

FIGS. 1A-C are perspective views of two rails being stepwise aligned, secured and latched to opposing side walls of a rack. In FIG. 1A, a system 10 includes a pair of longitudinally-extending rails 20 and a pair of opposing side walls 30 that are part of a rack. Each longitudinally-extending rail 20 has a proximal clip 21, a distal clip 23 and an optional intermediate clip 22. As shown, the clips 21-23 are cut and bent from a single metal sheet that also forms a rail side wall 24, a shelf 25, and a flange 26. Each rail further includes a latch 27 including an outwardly-directed latch element 28. Each latch 27 is preferably flexible to outwardly bias the latch element 28 so that the latch element will automatically and securely engage a latch hole 31 in the rack side wall 30. It should be recognized that the elements of the two rails that have been described so far are substantially mirror images of each other. As such, the two rails are not intended to be interchangeable with each other, although both rails may be secured to a given side wall at various elevations by engaging a different set of holes.

The rack side walls 30 have an EIA flange 32 along a proximal edge and a distal edge. The rigidity of the walls 30 may be increased by certain corrugations 33 and/or attachment to other members (not shown). The vertical positioning and spacing of the side walls 30 are also secured by interconnecting members (not shown), which may extend between the side walls across the top, bottom and other positions to provide a strong and stable rack. The vertical side walls 30 also include holes arranged in longitudinal sets 40 at various elevations. Each set 40 includes a proximal hole 41, a distal hole 43, and an optional intermediate hole 42. The number, position, and size of the holes in each set 40 must accommodate the set of clips provide on the rail 20 (here shown as clips 21-23). Additional holes may be included if desired. In one embodiment, at least one of the rails 20 further includes a boss 28 at the distal end of the rail to assist in lateral alignment of an electronic device or module.

The two opposing rails 20 are shown in a longitudinal position with each of the clips 21-23 aligned for insertion into holes 41-43 of set 40, which preferably have the same elevation within the rack. Accordingly, moving the rails 20 laterally as shown by arrows 12 positions the rail side wall 24 against the rack side wall 30 as shown by the dashed outline 24' and causes insertion of the clips into the holes. After the clips are inserted into the holes, the rails 20 are lowered in the direction of arrows 14 so that each rail hangs from the respective side wall 30 by its clips. Furthermore, the clips 21-23 engage the outer surfaces of the rack side walls 30 and the rail side walls 24 engage the inner surfaces of the rack side walls 30, thereby gripping the rack side wall and preventing lateral movement of the rails 20. The resulting position of the rails 20 and clips 21-23 is shown in FIG. 1B.

In FIG. 1B, both rails 20 are vertically supported from the holes 41-43 by the rack side walls 30. The clips 21-23, which now extend through the holes 41-43, are most clearly shown on right hand side wall (in the view shown). Furthermore, now that the rails 20 hang from the clips, the rail is lower than shown in FIG. 1A and a portion of the holes 41-43 can be seen extending above the top edge of the rails 20. Optionally, the height of the rail side wall 24 may be sufficiently tall to cover the holes 41-43.

As shown in FIG. 1B, the rail 20 could be easily lifted in order to withdraw the clips 21-23 from the holes 41-43. However, to continue the installation and secured the rails against accidental lifting, the rail 20 is moved longitudinally in the direction of arrows 16 so that each clip 21-23 slides from the respective hole 41-43 into a respective slot 44-46. The resulting position of the rail 20 and clips 21-23 is shown in FIG. 1C. This longitudinal movement performs a wiping or scraping action which allows for electrical contact and grounding of the rail to the chassis. In particular, the clip may have a dimple or boss (See element 35 in FIG. 3) that applies a concentrated force against the rack side wall to establish a good electrical connection.

In FIG. 1C, both rails 20 are vertically supported from the slots 44-46 by the rack side walls 30. Accordingly, the clips 21-23 are now offset in a proximal direction from the holes 41-43 in which they were originally inserted. In this position, the rails 20 cannot move vertically (neither up nor down) nor laterally. It may be further appreciated that the outwardly biased latch 27 has moved along with the foregoing movements of the rails 20 so that the latch element 28 has moved into alignment with the latch holes 31 in the rack side wall 30. The biased latch 27 causes the automatic insertion of the latch element 28 into the latch hole 31, thereby preventing longitudinal movement of the rail. Optionally, the latch may be designed to only prevent distal movement of the rail, since the end of the slot 45-47 or the EIA flange 32 may limit proximal movement of the rail.

Accordingly, FIG. 1C shows the rails 20 in their fully secured position, forming a shelf or bay for receiving an electronic device or module. It should be recognized that the latch 27 may be pulled manually, such as with a finger, with sufficient force to overcome the bias and withdraw the latch element 28 from the latch hole 31 so that the rail may be removed. Specifically, this requires releasing the latch, distally sliding the rail so that the clip moves out of the slot into the hole, raising the rail so that the clip releases the side wall 30, and laterally moving the rail to withdraw the clip from the hole. All of the movements used to install or remove a rail according to this embodiment can be easily performed from the front of the rack without any tools.

FIG. 2A is a perspective view of a proximal end of a rail (circled in FIG. 1A). This view shows the rail side wall 24 with the proximal clip 21. The latch 27 is secured to the rail side wall 24 and extends above the rail side wall 24. The latch 27 includes the latch element 28, which extends in the same generally lateral direction as the clip 21 since both the latch element and the clip operate to engage holes in the rack side wall 30. (See FIG. 1A). The proximal end of the rail also includes the flange 26, formed at a right angle to the rail side wall 24, for supporting a captive nut 34 is position to align with a hole in the EIA flange 32 of the rack and receive a bolt (not shown).

FIG. 2B is a top view of the proximal end of the rail 20 shown in FIG. 2A. The latch 27 is shown bent over the top of the rail side wall 24 in a relaxed position. When the rail 20 is being secured to a rack side wall 30, the latch 27 contacts the wall. As the clips draw the rail firmly against the rack side wall, the latch is flexed away from the wall causing a bias within the latch. When the latch element 28 becomes aligned with the latch hole 31 (See FIG. 1A), the latch element automatically enters the latch hole to prevents longitudinal movement of the rail 20.

FIG. 3 is a cross-sectional view of opposing rails secured to opposing side walls of a rack. This cross-section is taken along line 3-3 in FIG. 1B, wherein the distal clip 23 of each rack 20 has been inserted through the hole 43 in the rack side wall 30 and lowered to firmly engage the rack side wall 30 and support the rail 20. The distal clips 23, and all other clips for that matter, are preferably curved or include a dimple or boss 35 that engages the outer surface of the rack side wall 30 causing the clip to flex and grip the wall 30 between the boss 35 the rail side wall 24. This gripping engagement prevents lateral movement (side-to-side as shown in FIG. 3) of the rails 20. The configuration and use of the electrical connector 50 and the boss 28 will we discussed later.

Figure 4A:
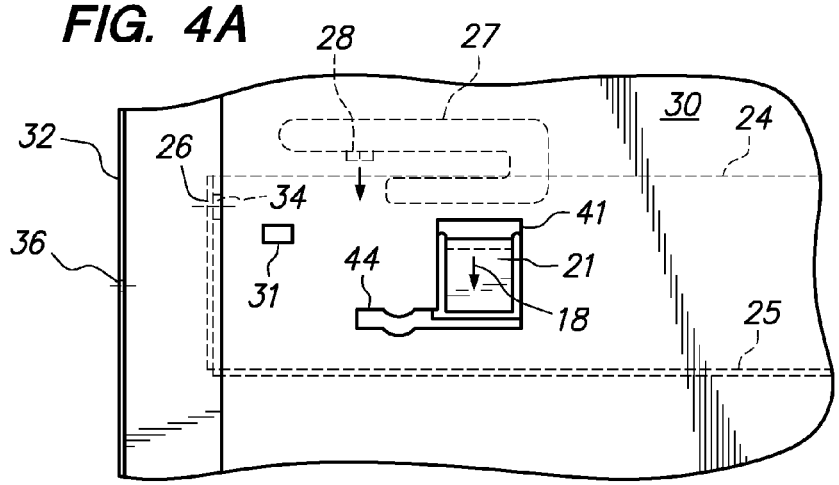
FIGS. 4A-C are side views of a hole in a rack in accordance with FIGS. 1A-C to highlight the aligning, securing and latching of a clip within the hole.
Figure 4B:
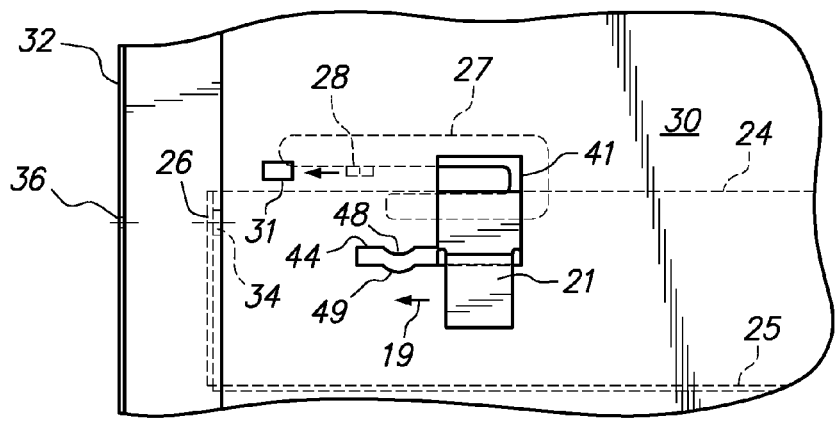
Figure 4C:
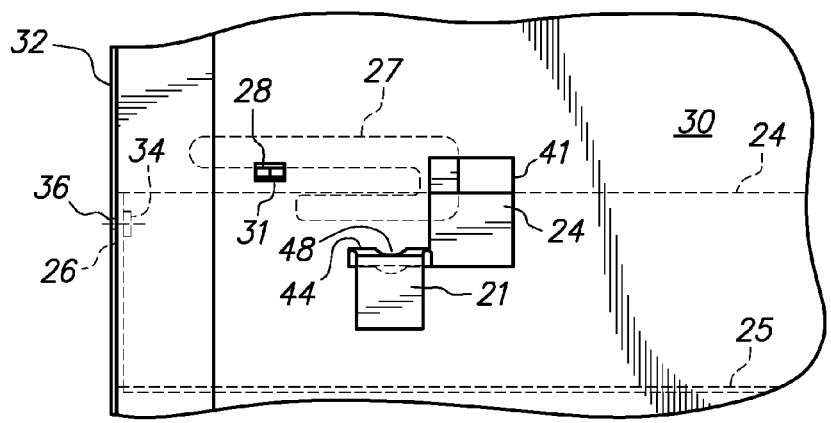

FIGS. 4A-C are side views of the proximal hole 41 in a rack side wall 30 in accordance with the circled portions of FIGS. 1A-C, respectively, which highlight the aligning, securing and latching of the proximal clip 21 within the proximal hole 41. Although these Figures show the engagement of the proximal clip with the proximal hole, it should be recognized that any of the clips in this embodiment engage a corresponding hole in the same manner. The proximal clip 21 and proximal hole 41 were selected for specific discussion in order to also show the movement of the latch 27, which is secured to the rail in a preferred position near the proximal end of the rail 20.

In FIG. 4A, the clip 21 is aligned with the hole 41 for insertion through the hole 41. Note that there is a gap between flange 26 at the proximal end of the rail side wall 24 and the EIA flange 32 of the rack. This gap will be closed when the rail is fully secured. Furthermore, the captive nut 34 that is secured to flange 26 is vertically offset out of alignment with a hole 36 through the EIA flange 32. The captive nut 34 and the hole 36 will be aligned when the rail is fully secured. Also note that the latch element 28 is neither vertically aligned nor longitudinally aligned with the latch hole 31 formed in the rack side wall 30. However, the latch element 28 will be received within the latch hole 31 when the rail is fully secured. If the rail is being secured to the rack side wall, then the next step is to lower the rail in the direction of the arrow 18.

In FIG. 4B, the clip 21, along with the entire rail 24, has been lowered so that the clip engages and/or "hangs" on the rack side wall 30. This is the same general position shown in the cross-sectional view of FIG. 3. Accordingly, the clip 21 extends about the outer surface of the rack side wall 30. Note that there is still a gap between the rail flange 26 and rack flange 32, but the captive nut 34 and the hole 36 are now axially aligned. Furthermore, the latch element 28 (which is biased against the rack side wall 30) is now longitudinally aligned with the latch hole 31. If the rail is being secured to the rack side wall, then the next step is to slide the rail in the proximal direction shown by the arrow 19.

In FIG. 4C, the clip 21 has been moved in the proximal direction to enter the slot 44. The slot 44 may be configured with a boss 48 and opposing relief 49 in order to firmly grip the clip 21 and prevent vertical movement of the clip (either upward or downward). The latch element 28 has been received into the latch hole 31 to prevent longitudinal movement of the rail until the latch is manually released. Still further, the rail flange 26 is now immediately adjacent or in contact with the EIA rack flange 32. Accordingly, FIG. 4C shows the rail fully secured to the rack side wall 30 and ready to receive and support an electronic device or module on the shelf 25.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
   a rack having a vertical wall with a set of holes at each of a plurality of elevations, each set of holes including at least a proximal hole having a lateral slot extending from a base of the proximal hole, the proximal hole being evenly spaced apart from a distal hole having a lateral slot extending from a base of the distal hole; and
   a longitudinally-extending rail having a set of clips for selectively securing the rail to the vertical wall, wherein the set of clips includes at least a proximal clip forming an inverted hook and selectively receivable in the proximal hole at a selected elevation for supporting a proximal end of the rail and a distal clip forming an inverted hook and selectively receivable in the distal hole at the selected elevation for supporting a distal end of the rail;
   wherein the proximal clip hangs in the proximal hole to limit downward movement of the proximal end of the rail and the distal clip hangs in the distal hole to limit downward movement of the distal end of the rail;
   wherein the proximal clip is receivable into the lateral slot extending from the base of the proximal hole to limit upward movement of the proximal end of the rail and the distal clip is receivable into the lateral slot extending from the base of the distal hole to limit upward movement of the distal end of the rail; and wherein at least one of the lateral slot extending from the base of the proximal hole and the lateral slot extending from the base of the distal hole is intermediate the proximal hole and the distal hole.

2. The system of claim 1, wherein the rail includes a shelf laterally-extending away from the vertical wall.

3. The system of claim 1, wherein the proximal clip comprises a portion supportable within the lateral slot extending from the proximal hole and has a width less than the width of the lateral slot extending from the proximal hole.

4. The system of claim 3, wherein each clip has a boss or angled profile to secure the rail against the rack wall.

5. The system of claim 1, wherein the slot includes a boss and an opposing relief.

6. The system of claim 1, wherein the rail further includes a selectively releasable latch for engaging a latch hole in the wall to limit longitudinal movement of the rail.

7. The system of claim 6, wherein the latch limits longitudinal movement of the rail in only one direction.

8. The system of claim 7, wherein the slot limits longitudinal movement of the rail in the direction opposite the one direction limited by the latch.

9. The system of claim 6, wherein the latch is disposed at the proximal end of the rail.

10. The system of claim 1, wherein the proximal end of the rail secures a captive nut in axial alignment with a flange hole along a proximal edge of the vertical wall.

11. The system of claim 1, characterized in that the rail can be installed in a 2U space of the rack without removing modules or rails immediately above or below the 2U space.

12. The system of claim 1, characterized in that the rail can be installed without access to both sides of the rack.

13. The system of claim 1, characterized in that the rail can be installed without access to the back of the rack.

14. The system of claim 1, wherein the rail is made of a metal sheet, and wherein the clips are integrally formed from the metal sheet.

15. The system of claim 1, wherein the rail is made of a single sheet of metal.

16. The system of claim 1, wherein the plurality of elevations for each set of holes are increments of 1U apart.

* * * * *